(12) United States Patent
Hong

(10) Patent No.: US 9,105,632 B2
(45) Date of Patent: Aug. 11, 2015

(54) SEMICONDUCTOR STRUCTURES

(71) Applicant: Semiconductor Manufacturing International Corp., Shanghai (CN)

(72) Inventor: Zhongshan Hong, Shanghai (CN)

(73) Assignee: SEMICONDUCTOR MANUFACTURING INTERNATIONAL CORP, Shanghai (CN)

( * ) Notice: Subject to any disclaimer, the term of this patent is extended or adjusted under 35 U.S.C. 154(b) by 0 days.

(21) Appl. No.: 14/520,286

(22) Filed: Oct. 21, 2014

(65) Prior Publication Data

US 2015/0035088 A1 Feb. 5, 2015

Related U.S. Application Data

(62) Division of application No. 13/919,276, filed on Jun. 17, 2013, now Pat. No. 8,895,389.

(30) Foreign Application Priority Data

Jan. 8, 2013 (CN) .......................... 2013 1 0006390

(51) Int. Cl.
*H01L 29/76* (2006.01)
*H01L 29/00* (2006.01)
*H01L 29/40* (2006.01)
*H01L 21/336* (2006.01)
*H01L 21/3205* (2006.01)
*H01L 21/4763* (2006.01)
*H01L 29/51* (2006.01)
(Continued)

(52) U.S. Cl.
CPC ........ *H01L 29/518* (2013.01); *H01L 21/76895* (2013.01); *H01L 21/76897* (2013.01); *H01L 21/823475* (2013.01); *H01L 29/401* (2013.01); *H01L 29/495* (2013.01); *H01L 29/511* (2013.01); *H01L 29/513* (2013.01); *H01L 29/66545* (2013.01); *H01L 29/66583* (2013.01); *H01L 29/78* (2013.01); *H01L 29/517* (2013.01)

(58) Field of Classification Search
CPC ..................... H01L 29/66545; H01L 29/7813; H01L 29/66734; H01L 29/4236; H01L 29/66348; H01L 21/823475; H01L 21/823871; H01L 21/76802; H01L 21/28061
USPC .................. 438/259, 283, 299, 588, 618, 637; 257/282, 330, 332, 387, 520, 622
See application file for complete search history.

(56) References Cited

U.S. PATENT DOCUMENTS

2007/0210339 A1 9/2007 Banachowicz et al.
2013/0320412 A1 12/2013 Yamasaki

*Primary Examiner* — Hsien Ming Lee
(74) *Attorney, Agent, or Firm* — Anova Law Group, PLLC

(57) ABSTRACT

A method is provided for fabricating a semiconductor structure. The method includes providing a semiconductor substrate having a plurality of first doped regions and second doped regions; and forming a first dielectric layer on the semiconductor substrate. The method also includes forming a first gate dielectric layer and a second gate dielectric layer; and forming a first metal gate and a second metal gate on the first gate dielectric layer and the second gate dielectric layer, respectively. Further, the method includes forming a third dielectric layer on the second metal gate; and forming a second dielectric layer on the first dielectric layer. Further, the method also includes forming at least one opening exposing at least one first metal gate and one first doped region; and forming a contact layer contacting with the first metal gate and the first doped region to be used as a share contact structure.

12 Claims, 4 Drawing Sheets

(51) Int. Cl.
*H01L 29/66* (2006.01)
*H01L 21/8234* (2006.01)
*H01L 29/49* (2006.01)
*H01L 29/78* (2006.01)
*H01L 21/768* (2006.01)

SEMICONDUCTOR STRUCTURES

CROSS REFERENCE TO RELATED APPLICATIONS

This application is a divisional of U.S. patent application Ser. No. 13/919,276, filed on Jun. 17, 2013, which claims priority to Chinese Patent Application No. 201310006390.9, filed on Jan. 8, 2013, all of which are incorporated herein by reference in their entirety.

FIELD OF THE INVENTION

The present invention generally relates to the field of semiconductor manufacturing technology and, more particularly, relates to semiconductor structures and fabrication techniques thereof.

BACKGROUND

With the rapid development on integrated circuit (IC) manufacturing technology, size of semiconductor in ICs, especially the size of MOS (Metal-oxide-semiconductor) devices, continues to shrink in order to meet the requirements for miniaturization and high-degree-integration of integrated circuits. As the size of the MOS transistor devices decreases continuously, the existing fabrication technology, which uses silicon oxide or silicon oxynitride as the gate dielectric layer, has been challenged. More specifically, transistors with silicon oxide or silicon oxynitride based gate dielectric layer may have certain problems, such as increased leakage current and impurity diffusion, which may affects the threshold voltage of the transistors. Thus, the performance of semiconductor devices based on such transistors may be impacted.

To solve these problems, transistors with high dielectric constant (high-K) metal gate structures have been introduced. By replacing the silicon oxide or silicon oxynitride gate dielectric materials with the high-K materials, the leakage current can be reduced while the size of the semiconductor devices decreases, and the performance of the semiconductor devices can be improved.

FIG. 1 illustrates an existing transistor having a high-K dielectric layer and a metal gate. The transistor includes a first dielectric layer 105 on the surface of a semiconductor substrate 100, and there is an opening (not shown) exposing the surface of the semiconductor substrate 100 in the first dielectric layer 105. The transistor also includes a high-K dielectric layer 101 covering sidewalls and the bottom of the opening, and a metal gate layer 103 on the high-K dielectric layer 103. Further, the transistor also includes a sidewall spacer 104 on the surface of the semiconductor substrate at both sides of high-K dielectric layer 101 and the metal gate layer 103, and a source region 106a and a drain region 106b in the semiconductor substrate 100 at both sides of the dielectric layer 101, the metal gate layer 103 and the sidewall spacer 104.

After forming the transistor, a back end of line (BEOL) process may be performed. The BEOL process may be used to connect the source region 106a, the drain region 106b, and/or the gate 103 with other semiconductor devices of the ICs.

FIG. 2 illustrates a share contact structure formed by the BEOL process for the existing transistor having a high-K dielectric layer and a metal gate. The share contact structure includes a first conductive via 124 connecting with the surface of the source region 106a, a second conductive via 125 connecting with the surface of the metal gate 103, a conductive layer 126 on the surfaces of the first conductive via 124 and the second conductive via 125. The share contact structure also includes an interlayer dielectric layer 105, and a second dielectric layer 120.

However, the BEOL process for forming the share contact structure of the existing transistor having the high-K dielectric layer 101 and the metal gate layer 103 may be relatively complex, and the production time and cost may be increased. The disclosed device structures, methods and systems are directed to solve one or more problems set forth above and other problems.

BRIEF SUMMARY OF THE DISCLOSURE

One aspect of the present disclosure includes a method for fabricating a semiconductor structure. The method includes providing a semiconductor substrate having a plurality of first doped regions and second doped regions; and forming a first dielectric layer on the semiconductor substrate. The method also includes forming a first gate dielectric layer and a second gate dielectric layer; and forming a first metal gate and a second metal gate on the first gate dielectric layer and the second gate dielectric layer, respectively. Further, the method includes forming a third dielectric layer on the second metal gate; and forming a second dielectric layer on the first dielectric layer. Further, the method also includes forming at least one opening exposing at least one first metal gate and one first doped region; and forming a first contact layer contacting with the first metal gate and the first doped region to be used as a share contact structure.

Another aspect of the present disclosure includes a semiconductor structure. The semiconductor includes a semiconductor substrate having a plurality of first doped regions and a plurality of second doped regions. The semiconductor structure also includes a first dielectric layer on the semiconductor substrate and a second dielectric layer on the first dielectric layer. Further, the semiconductor structure includes at least one first gate dielectric layer on the semiconductor substrate and a first metal gate on the first gate dielectric layer. Further, the semiconductor structure also includes a plurality of second gate dielectric layers, a second metal gate on each of the second gate dielectric layers, and a third dielectric layer on the second metal gate. Further, the semiconductor structure also includes a first contact layer electrically contacting with the first metal gate and the first doped region simultaneously.

Another aspect of the present disclosure includes another semiconductor structure. The semiconductor includes a semiconductor substrate having a plurality of first doped regions and a plurality of second doped regions. The semiconductor structure also includes a first dielectric layer on the semiconductor substrate and a second dielectric layer on the first dielectric layer. Further, the semiconductor structure includes at least one first gate dielectric layer on the semiconductor substrate and a first metal gate on the first gate dielectric layer. Further, the semiconductor structure also includes a plurality of second gate dielectric layers, a second metal gate on each of the second gate dielectric layer, and a third dielectric layer on the second metal gate. Further, the semiconductor structure also includes a first contact layer electrically contacting with the first metal gate and the first doped region simultaneously, and a second contact layer electrically contacting with the second doped region and electrically isolated with the second metal gates.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
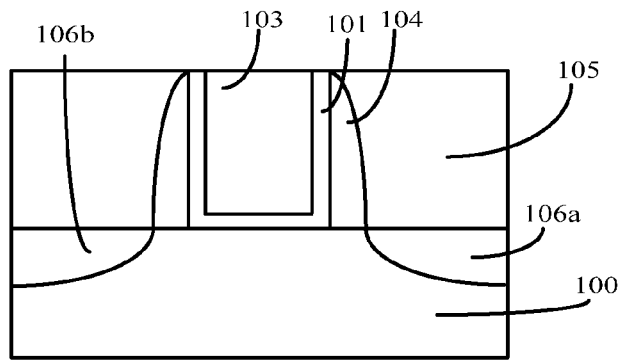
FIG. 1 illustrates an existing transistor having a high-K dielectric layer and a metal gate.
Figure 2:
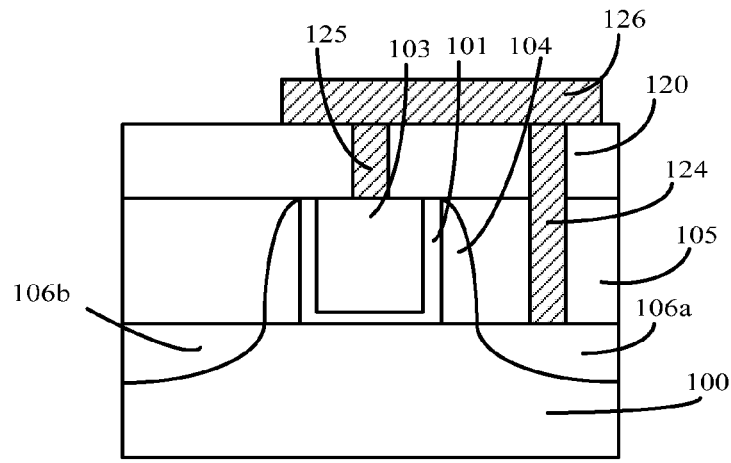
FIG. 2 illustrates a share contact structure formed by a back end of line process for an existing transistor having a high-K dielectric layer and a metal gate

Referring to FIG. 2, the first conductive via 124 and the second conductive via 125 may be formed by filling a metal material into a first opening (not shown) and a second opening (not shown) using a deposition process. A portion of the material over the second dielectric layer 120 may be removed by a chemical mechanical polishing (CMP) process. Further, the conductive layer 126 may also be formed by a deposition process, and an etching process after the deposition process. Thus, the process for the share contact structure may be relatively complex, and it may affect increasing the efficiency and reducing the production cost.

Further, because depth-to-width ratios of the first opening and the second opening may be relatively big, it may be easy to form defects in the metal filled in the first opening and the second opening, deteriorating the performance of the transistor. Further, top areas of the first via 124 and the second 125 may be relatively smaller than an area of the second dielectric layer 120, a subsequent CMP process may cause the second dielectric layer 120 to have a undesired surface, which may reduce the stability of the transistor. The disclosed embodiments overcome such problems by using self-aligned contact and share contact structures and fabrication methods.

Figure 10:
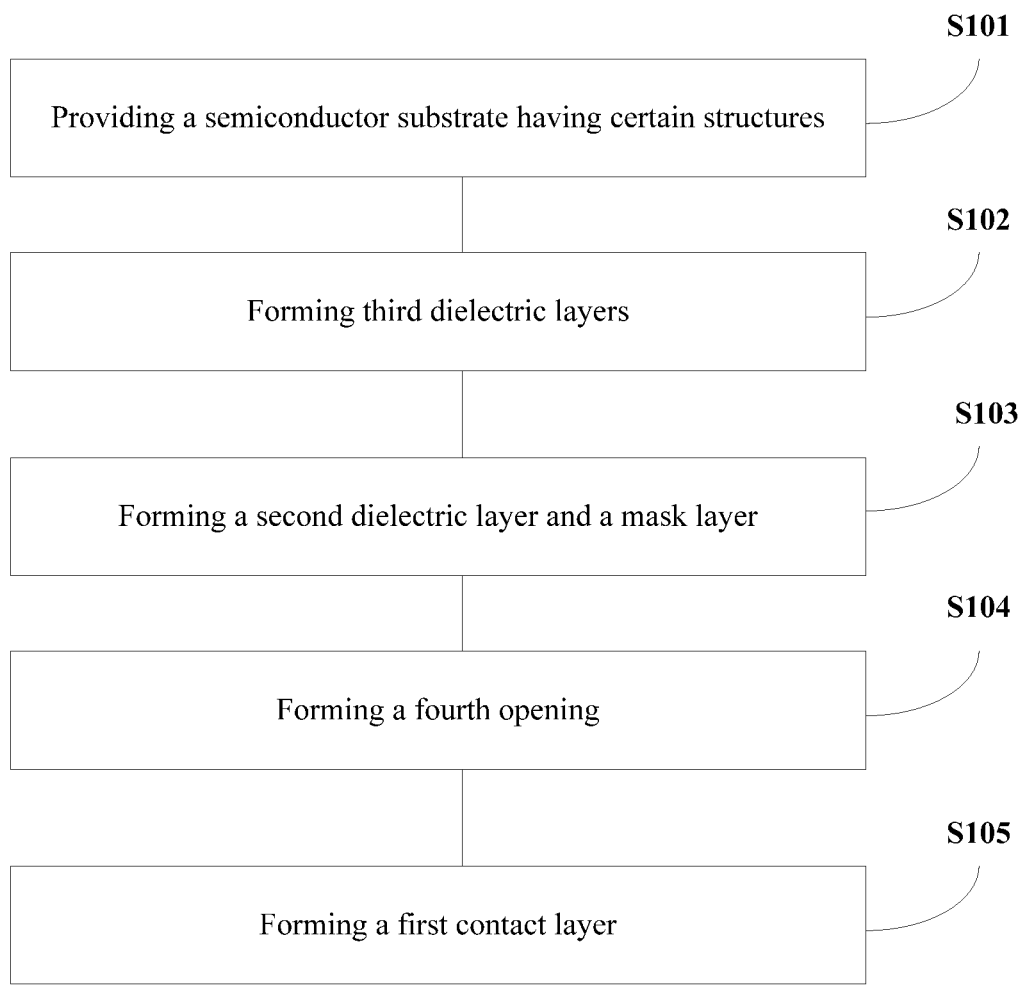
FIG. 10 illustrates an exemplary fabrication process for a semiconductor structure consistent with the disclosed embodiments.

FIG. 10 illustrates an exemplary fabrication process for a semiconductor structure, and FIGS. 3-7 illustrate exemplary semiconductor structures corresponding to various stages of the fabrication process.

Figure 3:
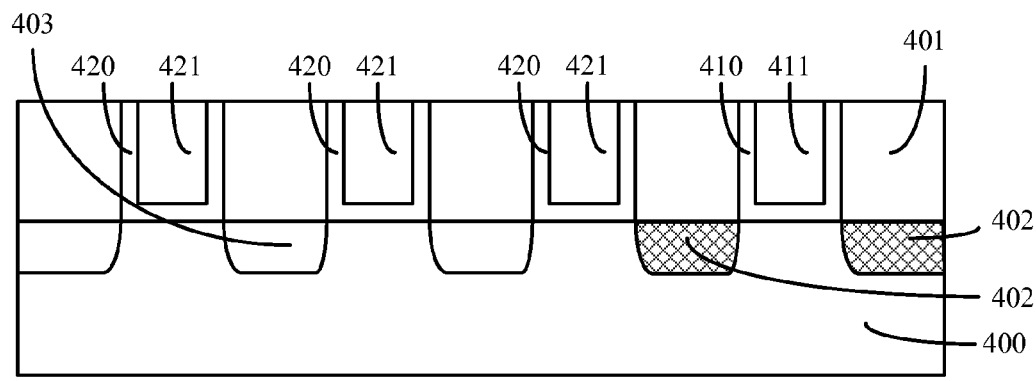
FIGS. 3-7 illustrate semiconductor structures corresponding to certain stages of an exemplary fabrication process for a semiconductor structure consistent with the disclosed embodiments.

As shown in FIG. 10, at the beginning of the fabrication process, a semiconductor substrate with certain structures is provided (S101). FIG. 3 illustrates a corresponding semiconductor structure.

As shown in FIG. 3, a semiconductor substrate 400 is provided. The substrate 400 have a first dielectric layer 401 on one surface. A plurality of first openings (not shown) and a plurality of second openings (not shown) may be formed in the dielectric layer 401. A portion of the semiconductor substrate 400 may be exposed by the first openings and the second openings. A plurality of first doped regions 402 are formed in the semiconductor substrate 400 at both sides of each of first openings. A first gate dielectric layer 410 is formed on the bottom and the sidewall of each of first opening. A first metal gate 411 is formed on the first gate dielectric layer 410. A second dielectric layer 420 is formed on the bottom and the sidewall of each of the second opening. A second metal gate 421 is formed on the second dielectric layer 420. Top surfaces of the first metal gate 411 and the second metal gate 421 may level with the top surface of the first dielectric layer 401.

The semiconductor substrate 400 may include any appropriate semiconductor materials, such as silicon, silicon on insulator (SOI), silicon germanium, carborundum, indium antimonide, lead telluride, indium arsenide, indium phosphide, gallium arsenidie, gallium antimonite, or alloy semiconductor, etc. The substrate 400 provides a base for subsequent processes and structures.

After providing the semiconductor substrate 400, a plurality of adjacent first dummy gate structures (not shown) and second dummy gate structures (not shown) may be formed on the semiconductor substrate 400. The first dummy gate structures may be made of any appropriate material, such as poly silicon, silicon oxide, silicon nitride, etc. In one embodiment, the first dummy gate structures and the second dummy gate structures are made of poly silicon.

In certain other embodiments, sidewall spacers may be formed on the surface of the semiconductor substrate 400 at both sides of each of the first dummy gate structures and the second dummy gate structures. The sidewall spacers may be made of one or more of silicon oxide, silicon nitride, silicon oxynitride, or appropriate low-K material, etc.

Referring to FIG. 3, after forming the first dummy gate structures and the second dummy gate structures, the first doped regions 402 may be formed in the semiconductor substrate 400 at both sides of each of the first dummy gate structures. The second doped regions 403 may also be formed in the semiconductor substrate 400 between adjacent second dummy gate structures. The first doped regions 402 and the second doped regions 403 may be formed by an ion implantation process using the first dummy gate structures and the second dummy gate structures as masks.

Further, referring to FIG. 3, after forming the first doped regions 402 and the second doped regions 403, the first dielectric layer 401 may be formed on the semiconductor substrate 400. The first dielectric layer may be formed by depositing a first dielectric material layer on the semiconductor substrate 400 and top surfaces and the sidewalls of the first dummy gate structures and the second dummy gate structures, followed by removing the first dielectric material layer on the top surfaces of the first dummy gate structures and the second dummy gate structures. Thus, the first dielectric layer 401 is formed, and the surface of the first dielectric layer 401 may level with the surfaces of the first dummy gate structures and the second dummy gate structures.

The first dielectric material layer may be made of any appropriate material, such as silicon oxide, silicon nitride, or silicon oxynitride, etc. The first dielectric material layer on the surfaces of the first dummy gate structures and the second dummy gate structures may be removed by any appropriate process, such as a chemical mechanical polishing (CMP) process, or a mechanical polishing process, etc. In one embodiment, the first dielectric material layer on the surfaces of the first dummy gate structures and the second dummy gate structures is removed by a CMP process.

In certain other embodiments, before forming the first dielectric layer 401, a barrier layer may be formed on the semiconductor substrate 400 and sidewalls and bottoms of the first dummy gate structures and the second dummy gate structures. The barrier layer may be made of any appropriate material, such as silicon nitride, silicon oxynitride, silicon carbide, or silicon carbonitride, etc. In one embodiment, the material for the barrier layer may be different from the material for the first dielectric layer 401.

The barrier layer may be used as a stop layer of the CMP process for removing the first dielectric material layer on the surfaces of the first dummy gate structures and the second dummy gate structures. When the barrier layer is exposed by the CMP process, the CMP process may be stopped, then an over polishing process may be performed to remove the barrier layer to expose the first dummy gate structures and the second dummy gate structures.

After forming the first dielectric layer 401, the first dummy gate structures may be removed, and the first openings may be formed. The second dummy gate structures may be removed, and the second openings may be formed. The first dummy gate structures and the second dummy gate structures may be removed by any appropriate process, such as a plasma etching process, or a wet chemical etching process, etc.

The number of the first openings may be equal to, or greater than one. When the number of the first openings is greater than one, and the plurality of the first openings are adjacent, the first doped regions 402 may be formed in the semiconductor substrate 400 between two adjacent first openings. The first doped regions 402 may be source/drain regions of a transistor. Further, if one of the first openings is adjacent to one of the second openings, the first doped regions 402 may be in the semiconductor substrate 400 between the first opening and the second opening which is adjacent to the first opening.

Further, the number of the second openings may be equal to, or greater than one. As shown in FIG. 3, a plurality of second doped regions 403 may be formed in the semiconductor substrate 400 between adjacent second openings which are filled with the second dielectric layers 420 and the second metal gates 421. The rather inside second opening may be adjacent to the rather inside first opening. In one embodiment, the number of the first openings is one, and the number of the second openings is three. The three second openings are adjacent.

In certain other embodiments, a liner layer (not shown) may be formed on the surface of each of the first opening. The liner layer (not shown) may also be formed on the surface of each of the second opening. The liner layer may be used to prevent the first metal gate 411 and the second metal gate 421 from diffusing into the semiconductor substrate 400.

The liner layer may be made of any appropriate material, such as silicon oxide, silicon nitride, silicon carbide, silicon oxynitride, or silicon carbonitride, etc. Various processes may be used to form the liner layer, such as a physical vapor deposition (PVD) process, a chemical vapor deposition (CVD) process, a flowable CVD (FCVD) process, a high aspect ratio (HARP) process, a high density plasma CVD (HDP CVD) process, or a spin-coating process.

Further, after forming the first openings and the second openings, a gate dielectric material layer may be formed on the surface of the first dielectric layer 401, and sidewalls and bottoms of the first openings and the second openings. After forming the gate dielectric material layer, a metal gate material layer may be formed on the gate dielectric material layer, and may fill up the first openings and the second openings. Then, a portion of the gate dielectric material layer and the metal gate material layer on the first dielectric layer 401 may be removed. Thus, referring to FIG. 3, the first gate dielectric layer 410 and the first metal gate 411 are formed in each of the first openings. Similarly, the second gate dielectric layer 420 and the second metal 421 are formed in each of the second openings.

The first gate dielectric layer 410 and the second gate dielectric layer 420 may be a single layer or a multiple-stacked layer. The first gate dielectric layer 410 and the second gate dielectric layer 420 may be made of one or more of high-K dielectric material including hafnium dioxide, zirconium dioxide, hafnium silicate, lanthanum oxide, zirconium silicate, titanium oxide, tantalum oxide, barium strontium titanate, barium titanate, strontium titanate, and aluminum oxide, etc. Appropriate low-K dielectric, such as silicon oxide, silicon nitride, or silicon oxynitride may also be used as the first gate dielectric layer 410 and the second gate dielectric layer 420. Various processes may be used to form the gate dielectric material layer, such as a physical vapor deposition (PVD) process, a chemical vapor deposition (CVD) process, a flowable CVD (FCVD) process, a high aspect ratio (HARP) process, a high density plasma CVD (HDP CVD) process, or a spin-coating process, etc.

Since the first gate dielectric layers 410 and the second dielectric layers 420 are made of the high-K material, the interface between the first gate dielectric layers 410 and the semiconductor substrate 400 may be unable to match. The interface between the second gate dielectric layers 420 and the semiconductor substrate 400 may also be unable to match. An oxide layer (not shown) may be formed on the surface of the semiconductor substrate 400 on the bottoms of the first openings and the second openings before forming the first gate dielectric layers 410 and the second gate dielectric layers 420. The oxide layer may be used to bond the first gate dielectric layers 410 and the second gate dielectric layers 420 with the semiconductor substrate 400. The leaking current of a transistor with such structures may be reduced, and the stability may be enhanced.

The metal gate material layer may be made of any appropriate metal material, such as copper, tungsten, aluminum, or silver. The metal gate material layer may also be made of any appropriate conductive alloy. Various process may be used to form the metal gate material layer, such as a CVD process, a PVD process, or an electroplating process, etc.

The portion of the gate dielectric material layer and the metal gate material layer on the first dielectric layer 401 may be removed by any appropriate process, such as a CMP process, or an etching process, etc. In one embodiment, the portion of the gate dielectric material layer and the metal gate material layer on the first dielectric layer 401 is removed by a CMP process.

In certain other embodiments, a first work function layer (not shown) may be formed between the first gate dielectric layer 410 and the first metal gate 411. A second work function layer (not shown) may be formed between the second gate dielectric layer 420 and the second metal gate 421.

The first work function layer and the second work function layer may be made of any appropriate material, such as titanium, tantalum, titanium nitride, tantalum, nitride, cobalt, titanium aluminum nitride, titanium aluminum cobalt alloy, ruthenium, copper manganese, titanium aluminum, or lanthanum, etc. Various processes may be used to form the first work function layer and the second work function layer, such as a PVD process, a sputter coating process, or a CVD process, etc.

The first work function layer and the second work function layer may be used to modulate the threshold voltage of a transistor. If the transistor is a PMOS transistor, the first work function layer and/or the second work function layer may be made of a material with a relatively high work function. If the transistor is an NMOS transistor, the first work function layer and/or the second work function layer may be made of a material with a relatively low work function. Thus, the threshold voltage of the transistor may be reduced.

In certain other embodiments, a protection layer (not shown) may be formed on the first gate dielectric layer 410 and the second gate dielectric layer 420. The protection layer may be made of any appropriate material, such as titanium nitride, tantalum nitride, or titanium aluminum nitride, etc.

The protection layer may be used to isolate the first gate dielectric layer 410 and the first metal gate 411. The protection layer may also be used to isolate the second gate dielectric layer 420 and the second metal gate 421. Further, the protection layer may be used to prevent impurities from diffusing into the work function layer and/or the metal gates during the fabrication process for the transistor. The impurities may contaminate the metal gates and/or the work function layer. Further, the protection layer may also be used to prevent a leakage current being generated between the gate dielectric layers and the metal gates when the transistor is working, and the isolation effect of the protection layer may be enhanced.

Figure 4:
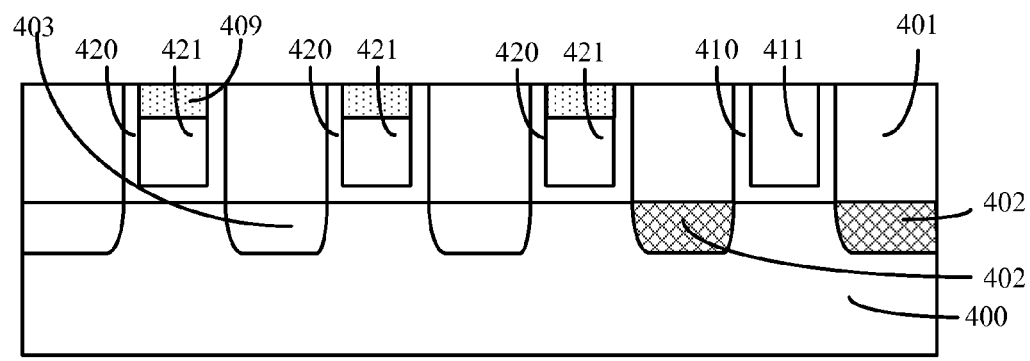

Returning to FIG. 10, after providing the semiconductor substrate 400 with first doped regions 402, the second doped regions 403, the first dielectric layers 401, the first gate dielectric layers 420, the second gate dielectric layers 410, the first metal gates 411, and the second metal gates 421, a third dielectric layer may be formed on each of the second metal gates 421 (S102). FIG. 4 illustrates a corresponding semiconductor structure.

As shown in FIG. 4, a third dielectric layer 409 may be formed on each of the second metal gates 421. The third dielectric layer 409 may be formed by: removing a top portion of the second metal gate 421 to form a third opening (not shown) lower than the surface of the first metal gate 411; and forming the third dielectric layer 409 leveling with the top surface of the first metal gate 411.

The top portion of the second metal gate 421 may be removed by any appropriate process, such as an etching process including a wet etching process or a dry etching process, etc., or a CMP process, etc. In one embodiment, the top portion of the second metal gate 421 is removed by an anisotropic dry etching process.

In one embodiment, a protection layer (not shown) may be formed on the surface of the first metal gates 411 when the dry etching process is performed to remove the top portion of the second metal gates 421. After the top portion of the second metal gates 421 is removed, the protection layer may be removed.

The third dielectric layer 409 may be made of any appropriate material, such as silicon oxide, silicon nitride, or silicon oxynitride, etc. In one embodiment, the third dielectric layer 409 is made of silicon nitride. In certain other embodiments, the first dielectric layer 401 and the third dielectric layer 409 may have an etching selectivity, i.e. they have different etching rates to a certain etching solution or a certain type of etching ion. Various processes may be used to form the third dielectric layer 409, such as a CVD process, or a PVD process, etc. The third dielectric layer 409 may be used to electrically isolate the second metal gates 421 and a subsequently formed first contact layer.

In certain other embodiments, if the a second work function layer is formed between the second metal gates 421 and the second gate dielectric layers 420, a portion of the second work function layer on the sidewalls may also be removed. Thus, the third dielectric layer 409 may be formed on both the surface of the second metal gate 421 and the surface of the second work function layer, the third dielectric layer 409 may electrically isolate the metal gate 421 and the second work function layer.

Figure 5:
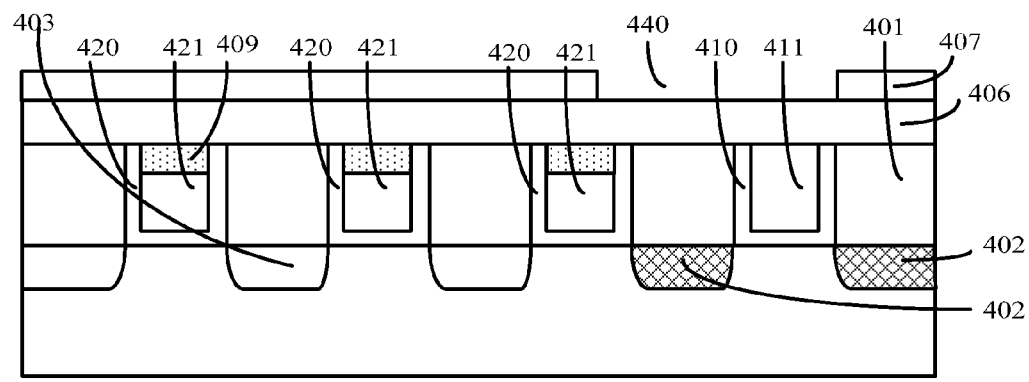

Returning to FIG. 10, after forming the third dielectric layer 409, a second dielectric layer may be formed on the first metal gates 411, the third dielectric layers 409 and the first dielectric layer 401. A mask layer may be formed on the second dielectric layer (S103). FIG. 5 illustrates a corresponding semiconductor structure.

As shown in FIG. 5, a second dielectric layer 406 is formed on the first metal gates 411, the third dielectric layers 409 and the first dielectric layer 401. A mask layer 407 is formed on the second dielectric layer 406. The second dielectric layer 406 and the third dielectric layers 409 may have an etching selectivity, i.e., they may have different etching rates for certain etching solutions, or etching ions. The mask layer 407 may have a sixth opening 440 exposing a portion of the second dielectric layer 406. The sixth opening 440 may be corresponding to at least one of the first doped regions 402 and the first metal gate 411.

The second dielectric layer 406 may be made of any appropriate material, such as silicon oxide, silicon nitride, or other low-K materials. Various processes may be used to form the second dielectric layer 406, such as a PVD process, a CVD process, an FCVD process, or an atomic layer deposition, etc. In one embodiment, the second dielectric layer 406 is formed by a CVD process.

Since the second dielectric layer 406 may be formed on the surface of the first metal gate 411, a subsequently formed first contact layer in the second dielectric layer 406 may be used to electrically connect with the first metal gate 411.

The sixth opening 440 in the mask layer 407 may be used to determine a position of the subsequently formed first contact layer. The mask layer 407 may be a photoresist mask, or a hard mask, etc. In one embodiment, the mask layer 407 is a photoresist mask. A process for the sixth opening 440 and the photoresist mask 407 may include: forming a photoresist layer on the surface of the second dielectric layer 406 by a spin-coating process; patterning the photoresist layer; and removing a portion of the photoresist layer corresponding to the position of the first metal gate 411 and the first doped region 402. Thus, the mask layer 407 with the sixth opening may be formed. The size and position of the mask layer 407 may be adjusted according to the process requirements of a subsequently formed first contact layer.

In one embodiment, the mask layer 407 may expose a position corresponding to only one first metal gate 411 and one first doped region 402, a subsequently formed fourth opening may only expose one first metal gate 411 and one first doped region 402. Thus, a subsequently formed first contact layer may electrically connect the first metal gate 411 with the first doped region 402, and a share contact structure may be formed.

Referring to FIG. 5, in one embodiment, the sixth opening 440 may also expose a portion of the surface of the second dielectric layer 406 corresponding to a position of the second metal gate 421, thus the area exposed by the mask layer 407 may be increased, the resolution requirement of a photolithography process for the sixth opening may be reduced.

Further, since the third dielectric layer 409 may be formed on the second metal gate 421; the third dielectric layer 409 and the second dielectric layer 406 may have an etching selectivity; and sidewall spacers may be formed on both sides of the second metal gate 421, the third dielectric layer 409 and the sidewall spacers may prevent the second metal gate 421 and the second gate dielectric layer 420 from being damaged during a subsequent process for the fourth opening. The problem of exposing the second metal gate 421 caused by technology errors during a process for exposing the first metal gate 411 may be avoided, thus it may ensure the stability of the transistor.

In certain other embodiments, the sixth opening 440 in the mask layer 407 may expose a position corresponding to the first metal gate 411 and first doped regions 402 at both sides of the first metal gate 411 simultaneously. A subsequently formed fourth opening may expose surfaces of the first metal gate 411 and the first doped regions 402 at both sides of the first metal gate 411. A subsequently formed first contact layer in the fourth opening may electrically connect the first metal gate 411 and the first doped regions 402 at both sides of the first metal gate 411 simultaneously. Thus, a share contact structure may be formed.

In certain other embodiments, if the number of the first openings is greater than one, the mask layer 407 may expose a position corresponding to any first doped region 402 and the first metal gates 411 at both sides of the first doped region 402. The first doped region 402 and the first metal gates 411 at both sides of the first doped region 402 may be electrically connected by a subsequently formed first contact layer, a share contact structure may be formed.

Figure 6:
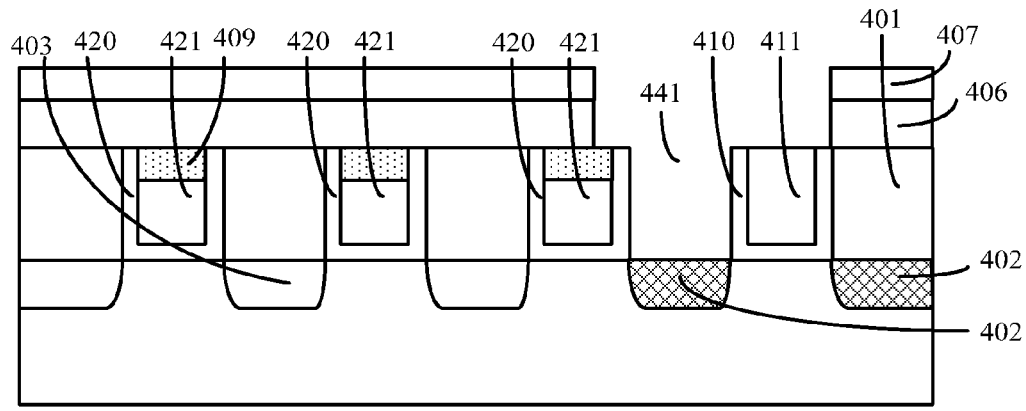

Returning to FIG. 10, after forming the second dielectric layer 406 and the mask layer 407, a fourth opening exposing at least one first doped region 402 and the one first metal gate 411 may be formed (S104). FIG. 6 illustrates a corresponding semiconductor structure.

As shown in FIG. 6, a fourth opening 441 is formed by removing a portion of the second dielectric layer 406 and a portion of the first dielectric layer 401 using the mask layer 407 as an etching mask. Surfaces of the first doped region 402 and the first metal gate 411 are exposed by the fourth opening 441.

The portion of the second dielectric layer 406 and the portion of the first dielectric layer 401 may be removed by any appropriate process, such as a dry etching process, or a wet etching process. In one embodiment, the portion of the second dielectric layer 406 and the portion of the first dielectric layer 401 are removed by a dry etching process.

Since the second dielectric layer 406 and the first metal gate 411 are made of different materials, a process for etching the second dielectric layer 406 may be unable to damage the surface of the first metal gate 411. After the portion of the second dielectric layer 406 is removed, the portion of the first dielectric layer 441 between the first metal gate 411 and the second metal gate 421 may be further etched, thus the first doped region 402 may be exposed. When the portion of the first dielectric layer 441 between the first metal gate 411 and the second metal gate 421 is etched, with the protection of the sidewall spacers (not shown), damages to sidewalls of the first metal gate 411 and the second metal gate 421 may be avoided.

Thus, it may only need one photolithography process and one etching process to form the fourth opening 441 with a desired quality. Further, it may only need one subsequent deposition process and one subsequent polishing process to form a first contact layer electrically connecting the first doped region 402 and the first metal gate 411 simultaneously. The first contact layer may be used as a share contact structure. The fabrication process for the share contact structure may be simplified.

Further, the process for a first contact layer may be relatively simple, thus the production cost may be reduced, and the process efficiency may be increased. The top size of the fourth opening 441 may be relatively large, which may cause the top surface of the first contact layer formed in the fourth opening 441 to have a relatively large size. Thus, damages to the second dielectric layer 406 caused by a subsequent polishing process for removing a metal material on the surface of the second dielectric layer 406 may be relatively small, and the transistor may be more stable.

Referring to FIG. 6, the second metal gate 421 may be protected by the third dielectric layer 409, the second metal gate 421 may be unlikely exposed by the fourth opening 441, thus the subsequently formed first contact layer and the second metal gate 421 may be electrically isolated by the third dielectric layer 409. A top portion of the third dielectric layer 409 may be removed by the etching process for the fourth opening 441, thus a thickness of the third dielectric layer 409 may be determined by the etching process. The desired thickness of the third dielectric layer 409 may ensure the third dielectric layer 409 to have an isolation effect.

In certain other embodiments, if barrier layers are formed between the first dielectric layer 401 and the semiconductor substrate 400, and between the first gate dielectric layer 410 and the second gate dielectric layer 420, a portion of the barrier layers contacting with first gate dielectric layer 410 and the second gate dielectric layer 420 may be kept when the first dielectric layer 401 is etched. The barrier layer may further protect sidewalls of the first metal gate 411 and the second metal gate 421, and prevent from being damaged by the etching process for the fourth opening 441. A portion of the barrier layer on the bottom of the fourth opening 441 may also be removed.

In certain other embodiments, if the mask 407 exposes the position corresponding to the first metal gate 411, and the first doped regions 402 at both sides of the first metal gate 411 simultaneously, the fourth opening 441 may expose surfaces of the first metal gate 411 and the first doped regions 402 at both sides of the first metal gate 411, a subsequently formed first contact layer may electrically contact with the first metal gate 411, and the first doped regions 402 at both sides of the first metal gate 411 simultaneously. Thus, a share contact structure may be formed.

In certain other embodiments, if the number of the first opening is greater than one, and the mask layer 407 may expose a position of any one of the first doped regions 402 and the first metal gates 411 at both sides of the first doped regions 402, the fourth opening 441 may expose the first doped region 402 and the first metal gates 411 at both sides of the first doped region 402 simultaneously, a subsequently formed first contact layer may electrically contact the first doped region 402 and the first metal gates 411 at both sides of the first doped region 402 simultaneously. Thus, a share contact structure may be formed.

Figure 7:
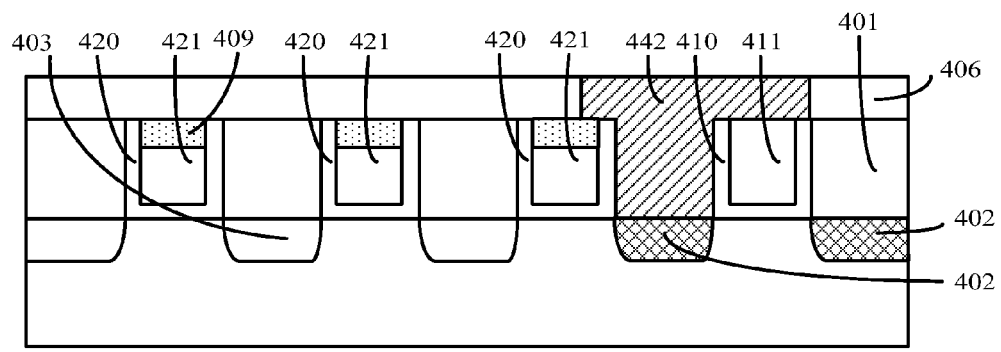

Returning to FIG. 10, after forming the fourth opening 441, a first contact layer may be formed in the fourth opening 441 (S105). FIG. 7 illustrates a corresponding semiconductor structure.

As shown in FIG. 7, a first contact layer 442 is formed in the fourth opening 441. The surface of the first contact layer 442 may level with the surface of the second dielectric layer 406; and the first contact layer 442 may electrically contact with at least one metal gate 411 and one first doped region 402.

The first contact layer 442 may be formed by: forming a metal material layer to fill up the fourth opening 441; and removing a portion of the metal material layer on the surface of the semiconductor substrate 400 by a polishing process. In one embodiment, the mask layer 407 may be removed before forming the metal material layer.

The metal material layer may be made of any appropriate metal, such as titanium, tungsten, aluminum, or silver, etc. In one embodiment, the metal material is titanium or tungsten.

Various processes may be used to form the metal material layer, such as a CVD process, a PVD process, a pulse laser deposition process, a sputtering process, or an electroplating process, etc. Various processes may be used to remove the portion of the metal material on the semiconductor substrate 400, such as a CMP process, or an etching process, etc. In one embodiment, the portion of the metal material on the semiconductor substrate 400 is removed by a CMP process.

Since the top size of the fourth opening 441 may be relatively large, it may be easy to fill the metal material, such as titanium or tungsten, etc. A desired quality of the first contact layer 442 may be obtained, and the performance of the transistor may be stable. Further, the CMP process for removing the portion of the metal material on the semiconductor substrate 400 may generate a relatively less damage on the second dielectric layer 406, which may also aid to increase the stability of the transistor.

In certain other embodiments, before forming the metal material layer, a stop layer (not shown) may be formed on the surface of the second dielectric layer 406, and surfaces of the sidewalls and the bottom of the fourth opening 441. The stop layer may be used as a CMP process stop layer. The first contact material layer may be formed on the stop layer, when the CMP process for removing the contact material layer on the second dielectric layer 406 reaches the stop layer, the CMP process may be stopped. Then, the CMP process may further remove the stop layer until the surface of the second dielectric layer 406 is exposed.

The stop layer may be made of any appropriate material, such as titanium nitride, or tantalum nitride, etc. Various processes may be used to form the stop layer, such as a CVD process, a PVD process, or an FCVD process, etc.

In one embodiment, the first contact layer 442 may electrically contact with at least one first metal gate 411 and at least one first doped region 402, and a share contact structure is formed. In certain other embodiments, the fourth opening 441 may expose surfaces of the first metal gate 411, and the first doped regions 402 at both sides of the first metal gate 411 simultaneously, thus the first contact layer 442 may be electrically contact with the first metal gate 411, and the first doped regions 402 at both sides of the first metal gate 411 simultaneously. Thus a share contact structure may be formed In certain other embodiments, if the number of the first opening is greater than one, and the fourth opening 441 exposes the first doped region 402 and the first metal gates 411 at both sides of the first doped region 402, the first contact layer 442 may contact the first doped region 402 and the first metal gates 411 at both sides of the first doped region 402 simultaneously. Thus, a share contact structure may be formed.

Referring to FIG. 7, the third dielectric layer 409 is formed on the second metal gate 421, the third dielectric layer 409 may protect the second metal gate 421 during the process for forming the fourth opening 441 (also referring to FIG. 6). The third dielectric layer 409 may also be used to electrically isolate the second metal gate 421 and the first contact layer 442. Further, the first contact layer 442 may electrically contact with at least one first metal gate 411 and at least one first doped region 402, and electrically isolate with the second metal gate 421, thus the first contact layer 442 may be used as a share contact of the first doped region 402 and the first metal gate 411. Further, the fourth opening 441 may be formed by a single process, the first contact layer 442 may be formed by a single process too, and the fabrication process of the share contact structure may be simplified.

Thus, a semiconductor structure may be formed by the above disclosed processes and methods. A corresponding semiconductor structure is shown in FIG. 7. The semiconductor includes a semiconductor substrate 400 having a plurality of first doped regions 402 and a plurality of second doped regions 402. The semiconductor structure also includes a first dielectric layer 401 on the semiconductor substrate 400 and a second dielectric layer 406 on the first dielectric layer 401. Further, the semiconductor structure includes at least one first gate dielectric layer 410 one the semiconductor substrate 400 and a first metal gate 411 on the first gate dielectric layer 410. Further, the semiconductor structure also includes a plurality of second gate dielectric layers 420, a second metal gate 421 on each of the second gate dielectric layer 420, and a third dielectric layer 409 on the second metal gate 421. Further, the semiconductor structure also includes a first contact layer 442 electrically contacting with the first metal gate 411 and the first doped region 402 simultaneously. The detailed structures and intermediate structures are described above with respect to the fabrication processes.

Figure 8:
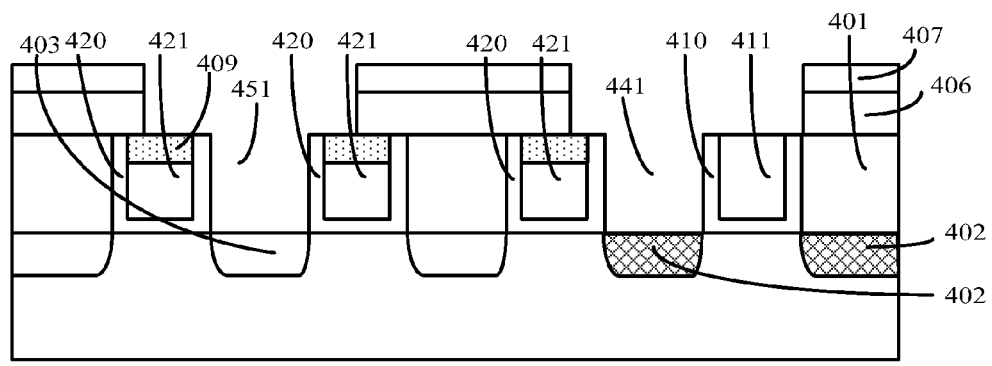
FIGS. 8-9 illustrate semiconductor structures corresponding to certain stages of an exemplary fabrication process for another semiconductor structure consistent with the disclosed embodiments.
Figure 9:
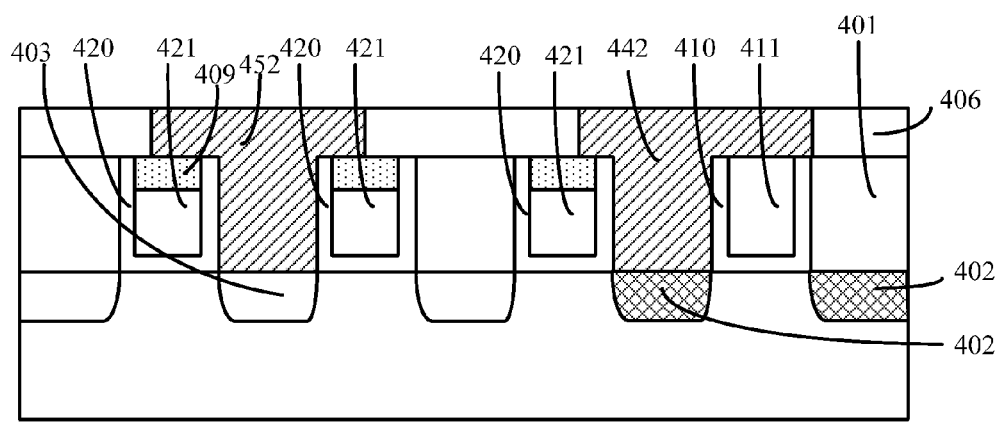

In certain other embodiments, the first contact layer 442 and a second contact layer may be formed simultaneously. The first contact layer 442 may be used as a share contact structure, and the second contact layer may be used as a self-aligned contact structure. FIGS. 8-9 illustrate semiconductor structures corresponding to certain stages of an exemplary fabrication process for a semiconductor structure with the first contact layer and the second contact layer consistent with the disclosed embodiments.

As shown in FIG. 8, starting from the semiconductor structure shown in FIG. 5, a fourth opening 441 and a fifth opening 451 may be formed in the first dielectric layer 401 and the second dielectric layer 406.

The fourth opening 441 and the fifth opening 451 may be formed by etching the first dielectric layer 401 and the second dielectric layer 406 using the mask layer 407 as an etching mask. The mask layer 407 may have a sixth opening (not shown) and a seventh opening (not shown).

The sixth opening may correspond to at least one first metal gate 411 and at least one first doped region 402. Referring to FIG. 8, after forming the fourth opening 441, the first metal gate 411 and the first doped region 402 may be exposed.

The seventh opening may correspond to at least one second doped region 403. Referring to FIG. 8, after forming the fifth opening 451, the second doped region 403 may be exposed.

Further, as shown in FIG. 9, after forming the fourth opening 441 and the fifth opening 451, a first contact layer 441 may be formed in the fourth opening 441; and a second contact layer 442 may be formed in the fifth opening 442. The first contact layer 442 and the second contact layer 452 may be formed by filling a metal material into the fourth opening 441 and the fifth opening 451, followed by removing a portion of the metal material layer on the mask layer 407, and the mask layer 407 itself by a CMP process. Top surfaces of the first contact layer 442 and the second contact layer 452 may level with the top surface of the second dielectric layer 406.

The first contact layer 442 and the second contact layer 452 may be made of any appropriate material, such as titanium, tungsten, aluminum, or silver, etc. In one embodiment, the metal material is titanium or tungsten. Various processes may be used to form the first contact layer 442 and the second contact layer 452, such as a CVD process, a PVD process, a pulse laser deposition process, a sputtering process, or an electroplating process, etc.

In one embodiment, the first contact layer 442 may electrically contact with the first metal gate 411 and the first doped region 402, thus the first contact layer 442 may be used as a share contact structure. The second contact layer 452 may electrically contact with the second doped region 403, and may be electrically isolated with the second metal gate 421 by the third dielectric layer 409. Since the second doped regions 403 may be formed by an ion implantation process using gate structures as a mask, when the second doped regions 304 are used as source/drain regions, such source/drain regions may refer as self-aligned source/drain regions. Thus, the second contact layer 452 may be used as a self-aligned contact structure.

In certain other embodiments, the first contact layer 442 may electrically contact with at least one first metal gate 411, and may be electrically isolated with the first doped region by the first dielectric layer 401. The first contact layer 442 may be used to electrically connect the first metal gate 411 with other devices and/or structures to match certain industry requirements.

The first contact layer 442 and the second contact layer 452 may be formed simultaneously, and the fabrication process of integrated circuits may be simplified. The size of the seventh opening for forming fifth opening 452 may be relatively large, and the resolution requirement of a photolithography process for the seventh opening may be reduced.

Thus, a semiconductor structure may be formed by the above disclosed processes and methods. A corresponding semiconductor structure is shown in FIG. 9. The semiconductor includes a semiconductor substrate 400 having a plurality of first doped regions 402 and a plurality of second doped regions 403. The semiconductor structure also includes a first dielectric layer 401 on the semiconductor substrate 400 and a second dielectric layer 406 on the first dielectric layer 401. Further, the semiconductor structure includes at least one first gate dielectric layer 410 on the semiconductor substrate 400 and a first metal gate 411 on the first gate dielectric layer 410. Further, the semiconductor structure also includes a plurality of second gate dielectric layers 420, a second metal gate 421 on each of the second gate dielectric layers 420, and a third dielectric layer 409 on the second metal gate 421. Further, the semiconductor structure also includes a first contact layer 442 electrically contacting with the first metal gate 411 and the first doped region 402 simultaneously, and a second contact layer 452 electrically contacting with the second doped region 403 and electrically isolated with the second metal gates 421. The detailed structures and intermediate structures are described above with respect to the fabrication processes.

The above mentioned processes may also be used to form a three dimensional semiconductor structure, such as a fin field-effect transistor. A three dimensional transistor with a desired performance and stability may be obtained by the present invention.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A semiconductor structure, comprising:
   a semiconductor substrate having a plurality of first doped regions and a plurality of second doped regions;
   a first dielectric layer on the semiconductor substrate;
   a second dielectric layer on the first dielectric layer;
   at least one first gate dielectric layer on the semiconductor substrate;
   a first metal gate on the first gate dielectric layer;
   a plurality of second gate dielectric layers;
   a second metal gate on each of the plurality of second gate dielectric layers;
   a third dielectric layer on the second metal gate; and
   a first contact layer electrically contacting with the first metal gate and the first doped region simultaneously as a share contact structure, wherein the first contact layer comprises a metal material filled in an opening exposing at least one first metal gate and at least one first doped region.

2. The semiconductor structure according to claim 1, wherein:
   the first contact layer is isolated with the second metal gate, and used as a share contact structure.

3. The semiconductor structure according to claim 1, wherein:
   a barrier layer is formed between the first dielectric layer and the semiconductor substrate.

4. The semiconductor structure according to claim 1, wherein:
   sidewall spacers are formed on the semiconductor substrate at both sides of the first gate dielectric layers and the second gate dielectric layers.

5. The semiconductor structure according to claim 1, wherein:
   the first contact layer is made of titanium or tungsten;
   the first gate dielectric layer and the second gate dielectric layers are made of high dielectric constant material;
   the first dielectric layer and the second dielectric layer are made of one of silicon oxide and low dielectric constant material;
   the first metal gate and the second metal gate are made of copper, tungsten, aluminum, or silver; and
   the third dielectric layer is made of silicon nitride.

6. The semiconductor structure according to claim 1, further comprising: a work function layer disposed on the first gate dielectric layer and the second dielectric layer.

7. A semiconductor structure, comprising:
   a semiconductor substrate having a plurality of first doped regions and a plurality of second doped regions;
   a first dielectric layer on the semiconductor substrate;
   a second dielectric layer on the first dielectric layer;
   at least one first gate dielectric layer on the semiconductor substrate;
   a first metal gate on the first gate dielectric layer;
   a plurality of second gate dielectric layers;
   a second metal gate on each of the second gate dielectric layers;
   a third dielectric layer on the second metal gate;
   a first contact layer electrically contacting with the first metal gate and the first doped region simultaneously as a share contact structure; and
   a second contact layer electrically contacting with the second doped region, wherein the first contact layer and the second contact layer comprise a metal material simultaneously filled in an opening exposing at least one first metal gate and at least one first doped region, and in another opening exposing the second doped region.

8. The semiconductor structure according to claim 7, wherein:
   the first contact layer is used as a share contact structure; and
   the second contact layer is used as a self-aligned contact structure.

9. The semiconductor structure according to claim 7, wherein:
   the second contact layer is isolated with the second metal gates by the third dielectric layer.

10. The semiconductor structure according to claim 7, wherein:
    the first contact layer and the second contact layer are made of titanium or tungsten.

11. The semiconductor structure according to claim 7, further comprising: a work function layer disposed on the first gate dielectric layer and the second dielectric layer.

12. The semiconductor structure according to claim 7, wherein:
- the first contact layer is made of titanium or tungsten;
- the first gate dielectric layer and the second gate dielectric layers are made of high dielectric constant material;
- the first dielectric layer and the second dielectric layer are made of one of silicon oxide and low dielectric constant material;
- the first metal gate and the second metal gate are made of copper, tungsten, aluminum, or silver; and
- the third dielectric layer is made of silicon nitride.

* * * * *